United States Patent [19]

Kanno et al.

[11] Patent Number: 5,371,324
[45] Date of Patent: Dec. 6, 1994

[54] RIBBON CABLE

[75] Inventors: Toshiaki Kanno; Hidenori Yamanashi; Tsuneyuki Horiike, all of Shizuoka, Japan

[73] Assignee: Yazaki Corporation, Tokyo, Japan

[21] Appl. No.: 980,700

[22] Filed: Nov. 24, 1992

[30] Foreign Application Priority Data

Nov. 28, 1991 [JP] Japan .................. 3-098248[U]

[51] Int. Cl.$^5$ ............................................. H01B 7/08
[52] U.S. Cl. .................. 174/117 F; 174/117 FF; 174/126.2
[58] Field of Search ........... 174/117 F, 117 FF, 126.2

[56] References Cited

U.S. PATENT DOCUMENTS

| | | | |
|---|---|---|---|
| 3,168,617 | 2/1965 | Richter | 174/117 FF |
| 3,391,246 | 7/1968 | Freeman et al. | 174/117 FF |
| 3,523,844 | 8/1970 | Crimmins et al. | 174/117 FF |
| 4,373,977 | 2/1983 | Rothwarf | 174/126.2 |
| 4,642,201 | 2/1987 | Vogel | 252/503 |
| 4,704,231 | 11/1987 | Chung | 252/511 |
| 4,946,892 | 8/1990 | Chung | 524/847 |

FOREIGN PATENT DOCUMENTS

| | | |
|---|---|---|
| 1723580 | 4/1956 | Germany . |
| 2828824 | 1/1980 | Germany . |
| 7834416 | 3/1983 | Germany . |
| 60-184534 | 9/1985 | Japan . |
| 212903 | 3/1990 | Japan . |

*Primary Examiner*—Morris H. Nimmo
*Attorney, Agent, or Firm*—Sughrue, Mion, Zinn, Macpeak & Seas

[57] ABSTRACT

A ribbon cable which is light weight, noncorrosive and exhibits excellent electrical conductivity properties. The cable includes a plurality of conductors, each composed of exfoliated graphite, which are arranged to extend parallel to each other and are sheathed with an electrical insulative material molded of a synthetic resin. In another embodiment, a conductor composed of exfoliated graphite and metallic conductors, each having an elongated rectangular cross-sectional shape, are arranged to extend parallel to each other. The conductors are sandwiched between opposing sheets of synthetic resin which are adhered to each other.

4 Claims, 2 Drawing Sheets

RIBBON CABLE

BACKGROUND OF THE INVENTION

1. Field of the Invention

The present invention relates to a ribbon cable for use in electrical equipment such as telephones, electrostatic copying machines, microcomputers, printers, electronic calculators, video tape recorders, electronic ranges, various kinds of electric instruments mounted on a vehicle or the like.

2. Background

A typical conventional ribbon cable is shown in FIG. 4. As illustrated, the cable includes a plurality of metallic wires A, each made of soft copper, hard copper, beryllium copper or a similar copper alloy and having a rectangular crosssectional shape, and a sheathed layer b molded of an electrically insulating material such as rubber, synthetic resin or the like and having a relatively large width and a small thickness, with the metallic wires a sandwiched therebetween.

However, each metallic conductor is relatively heavy and corrodes easily in certain environments. Therefore, it has been proposed to make the conductors out of an electrically conductive composite material which is light weight and noncorrosive. The proposed composite material includes a thermoplastic resin as a matrix to which is added a carbon black, graphite powder and graphite fiber. Such an arrangement is disclosed in Japanese Patent Unexamined Publication No. SHO. 60-184,534. However, it has been found that the proposed composite material is disadvantageous in that it has a resistivity of approximately $10^{-2}$ $\Omega$·cm, resulting in insufficient electrical conductivity.

Since a thermoplastic synthetic resin is employed as the matrix of the ribbon cable, when the above electrically conductive composite material is used as the conductor, it has been discovered that the synthetic resin deforms due to the high temperature experienced under normal conditions. On the other hand, when a thermoplastic synthetic resin having a higher resistance to deformation at elevated temperatures is used as a raw material for the electric conductive composite material, it exhibits poor flexibility. Thus, the conventional ribbon cable does not exhibit properties required for use as a conductor.

The use of exfoliated graphite produced by oxidizing and baking graphite has been considered as an electrically conductive material which is light weight and non-corrosive, as disclosed in Japanese Patent Examined Publication No. Hei. 2-12,903. Exfoliated graphite has usually been used as a packing incorporated in a shaft shielding portion of a hydraulic machine or hydraulic equipment such as a valve, a pump or the like but it could not be practically used as a material for a conductor because of its very low mechanical strength.

SUMMARY OF THE INVENTION

The present invention has been made in consideration of the foregoing background and its object resides in providing a ribbon cable which is light weight, non-corrosive and exhibits excellent electrical conductivity properties.

To accomplish the above object, according to one aspect of the present invention, there is provided a ribbon cable which is characterized in that a plurality of conductors, each composed of exfoliated graphite, are arranged to extend parallel to each other and are sheathed with an electrical insulative material molded of a synthetic resin.

In addition, according to another aspect of the present invention, there is provided a ribbon cable which is characterized in that a conductor composed of exfoliated graphite and metallic conductors each having an elongated rectangular cross-sectional shape are arranged to extend parallel to each other and both the conductors are then sheathed with an electrically insulative material molded of a synthetic resin.

According to the present invention, conductors constituting a ribbon cable are prepared by cutting a graphite sheet into elongate pieces each having a relatively large width and small thickness.

It is preferable that the graphite sheet be made of natural graphite having excellent crystallization properties. In practice, it is preferable that the graphite be exfoliated, e.g., GRAFOIL commercially sold under a trade name is worked to exhibit a sheet-like contour to thereby form a graphite sheet. The exfoliated graphite has resistivity of about $7 \times 10^{-4}$ $\Omega$·cm. Thus, the exfoliated graphite can practically be used as a raw material employable for the conductors of the ribbon cable, because the foregoing resistivity is very low compared with a resistivity of $10^{-2}$ $\Omega$·cm associated with an electric conductive composite material made of a thermoplastic synthetic resin, as noted above. While the exfoliated graphite has a very low mechanical strength, it can be satisfactorily used as a raw material for the conductors of the ribbon cable as long as it is sheathed with an electrically insulative material molded of a synthetic resin. Specifically, the conductors are tightly sandwiched between to strips of synthetic resin which serve as reinforcement materials for the exfoliated graphite.

To assure that the sheet of exfoliated graphite exhibits an increased mechanical strength, it is recommendable that it be reinforced with a core-shaped reinforcement material such as a metallic net, glass fiber or the like each of which is filled in the exfoliated graphite.

In addition, a sheet of intercalated graphite compounds having its electric conductivity improved by intercalating the graphite sheet with halogen, halogenide, metallic halogenide or the like can be used as a conductor.

A film-shaped synthetic resin molded by bridged polyvinyl chloride, polyester, polyimide or the like is preferably employable as an electrically insulative material molded of a synthetic resin for covering the conductors. In this connection, it is preferable that one surface of the electrically insulative material be coated with an adhesive so that the mating sheets tightly adhere to one another.

According to the present invention, since exfoliated graphite is used as the conductor in the ribbon cable, the conductors do not experience any corrosion. Consequently, the present invention has provided a ribbon cable which is light weight and exhibits excellent electrical conductivity.

DETAILED DESCRIPTION OF THE PREFERRED EMBODIMENTS

The present invention will now be described in detail hereinafter with respect to structure and function thereof particularly with reference to the accompanying drawings which illustrate preferred embodiments thereof.

Figure 1:
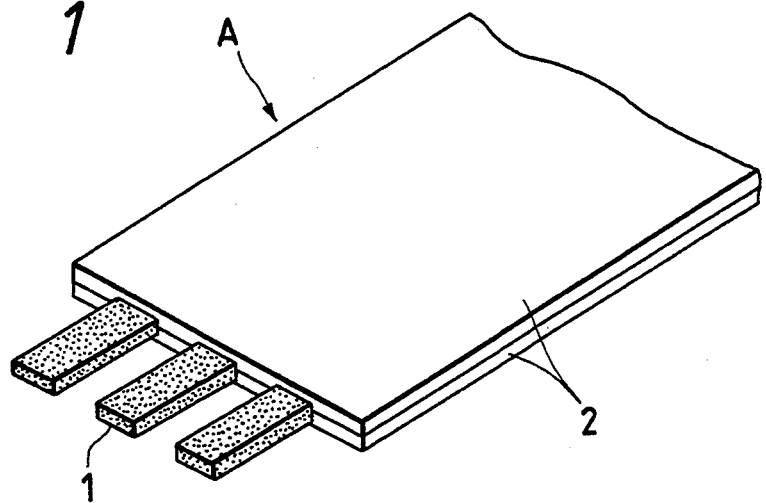
FIG. 1 is a fragmentary enlarged perspective view of a ribbon cable in accordance with an embodiment of the present invention.

As shown in FIG. 1, according to a first embodiment of the invention, a sheet of GRAFOIL (produced by Union Carbide Inc.) having a thickness of 0.25 mm and a width of 1.5 mm serve as conductors 1. In the illustrated case, three conductors 1 extend parallel to each other in a spaced relationship, and are sandwiched between two polyester tapes 2 having a thickness of 0.05 mm and a width of 10 mm which are adhered to each other. The ribbon cable A thus includes three conductors 1 each composed of exfoliated graphite sheathed with the polyester tapes 2, has a unit weight of 5.3 g/m and exhibits an electrical resistance value of 30.0 $\Omega$/m.

Figure 2:
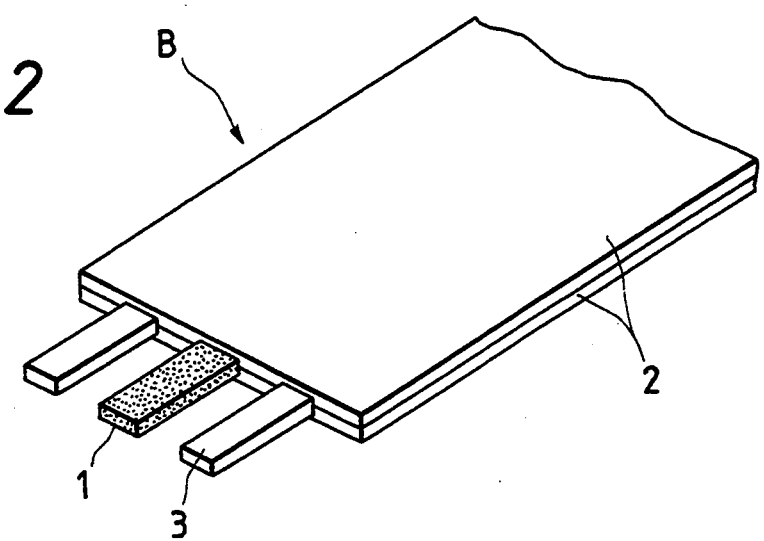
FIG. 2 is a fragmentary enlarged perspective view of a ribbon cable in accordance with another embodiment of the present invention.

In the second embodiment illustrated in FIG. 2, the same conductor made of exfoliated graphite in accordance with the first embodiment of the present invention is used as a conductor 1, and two tin-plated soft copper wires 3 extend parallel to each other in a spaced relationship. The tinplated copper wires each have a thickness of 0.15 mm and a width of 1.5 mm exhibiting a rectangular cross-sectional shape. The conductor 1 and the soft copper wires 3 are sandwiched between two polyester tapes 2 in a tightly clamped state in the same manner as the first embodiment of the present invention, thereby forming a three-cored ribbon cable B having a unit weight of 9.2 g/m. i0

The three-cored ribbon cable B can be effectively used in the design of various types of machines or equipment which are compact and light weight by selecting the conductors employed for the ribbon cable depending on the electrical current adapted to flow through the circuit in such a manner that a comparatively high intensity of electric current flows through each tinplated soft copper wire 3 and a comparatively low intensity of electric current flows through the conductor 1 composed of exfoliated graphite. Of course, the number of conductors in the ribbon cable is not limited to three in the embodiments of the present invention.

COMPARATIVE EXAMPLE

Three tin-plated soft copper wires, acting as conductors, each having a thickness of 0.15 mm and a width of 1.5 mm extend parallel to each other in spaced apart relationship. The conductors are sandwiched between two polyester tapes in the tightly clamped state in the same manner as the first embodiment of the present invention, forming a three-cored ribbon cable C. The ribbon cable C has a unit weight of 10.8 g/m and exhibits an electric resistance value of 0.0848 $\Omega$/m.

As is apparent from the above description, the ribbon cable A produced in accordance with the first embodiment of the present invention is considerably lighter in weight as compared with the conventional ribbon cable C described above as a comparative example, and moreover, exhibits an electric resistance value of 30.0 $\Omega$/m. Thus, it can be seen that the ribbon cable A of the first embodiment can be used with an electrical current as high as several tens of mAflowing therethrough. If a higher electrical current is required to flow through the conductor, it is recommended that the ribbon cable B having metallic conductors shaped in accordance with the second embodiment of the present invention be used as a conductor.

Figure 3:
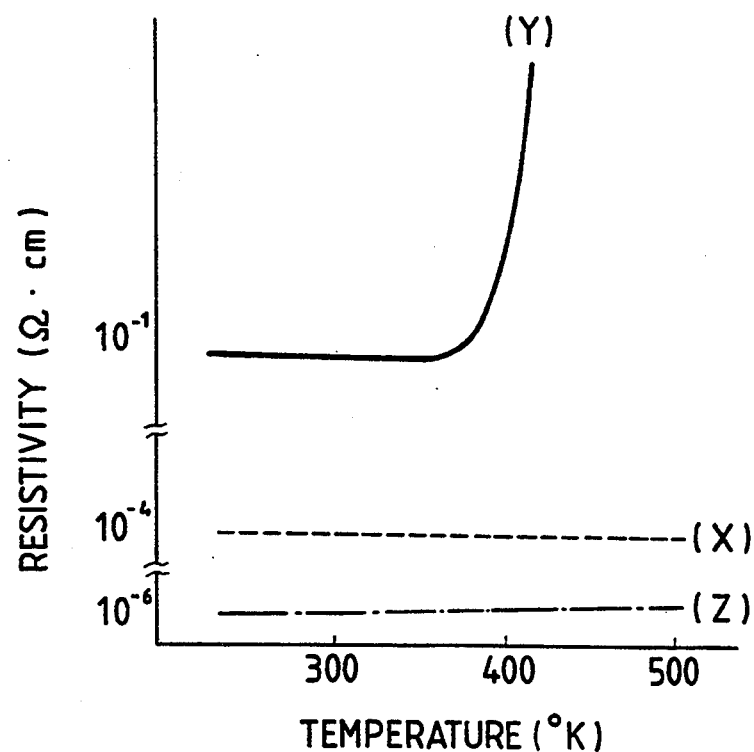
FIG. 3 is a graph which shows how an electric resistance rate of each of three conductors as a function of working temperature.
Figure 4:
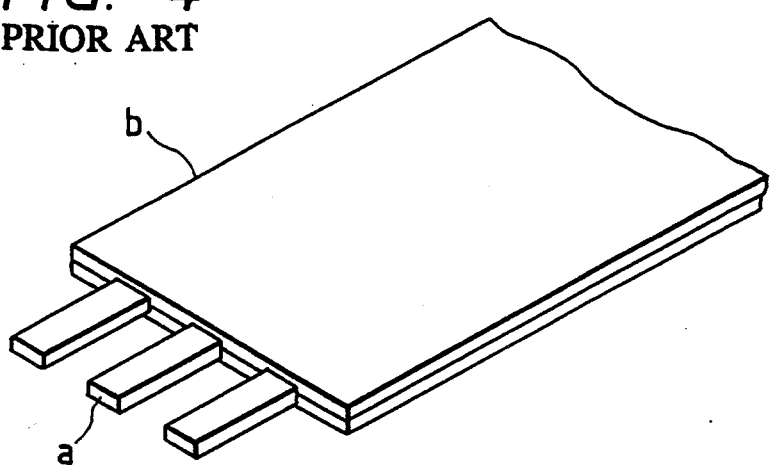
FIG. 4 is a fragmentary enlarged perspective view of a conventional ribbon cable.

FIG. 3 is a graph illustrating the relationship between resistivity and temperature for various kinds of conductors with the abscissa representing absolute temperature (° K.), and the ordinate representing the resistivity ($\Omega$·cm).

As is apparent from FIG. 3, conductor X produced using exfoliated graphite in accordance with the present invention exhibits a resistivity which is much lower than a conventional polyethylene based or carbon based electrically conductive composite material Y. In addition, in contrast with the conventional electrically conductive composite material Y in which resistivity varies largely when the working temperature exceeds about 360° K., the resistivity of the conductor X made of exfoliated graphite varies only slightly with a variation in working temperature. Thus, it can be seen that the conductor X made of exfoliated graphite exhibits excellent properties. It should be noted that reference letter z in FIG. 3 designates the resistivity of copper.

The ribbon cable of the present invention constructed in the above-described manner does not corrode in the standard, working environment. Further, in contrast with the conventional ribbon cable including metallic conductors as core wires. the ribbon cable of the present invention is light weight and can be used in the design of compact electrical equipment while improving the reliability of the same.

What is claimed is:

1. A ribbon cable, comprising:
   a plurality of conductors each composed of exfoliated graphite and extending parallel to each other; and
   an electrical insulator in which said conductors are imbedded, wherein said conductors are reinforced with a reinforcement material selected from the group consisting of a metallic net, glass fibers, and carbon fibers.

2. The cable of claim 1, wherein said insulator includes a pair of synthetic resin sheets which are adhered to one another with said conductors sandwiched therebetween.

3. A ribbon cable, comprising:
   a first conductor comprising exfoliated graphite and a second conductor comprised of a metal, said first and second conductors extending parallel to each other; and
   an electrical insulator in which said first and second conductors are imbedded, wherein said first conductor is reinforced with a reinforcement material selected from the group consisting of a metallic net, glass fibers, and carbon fibers.

4. The cable of claim 3, wherein said insulator includes a pair of synthetic resin sheets which are adhered to one another with said conductors sandwiched therebetween.

* * * * *